United States Patent [19]
Morkoc et al.

[11] Patent Number: 4,827,320
[45] Date of Patent: May 2, 1989

[54] SEMICONDUCTOR DEVICE WITH STRAINED INGAAS LAYER

[75] Inventors: Hadis Morkoc, Urbana, Ill.; John Klem, Davenport, Iowa; William T. Masselink, Urbana, Ill.; Timothy S. Henderson, Urbana, Ill.; Andrew A. Ketterson, Evanston, Ill.

[73] Assignee: University of Illinois, Urbana, Ill.

[21] Appl. No.: 909,975

[22] Filed: Sep. 19, 1986

[51] Int. Cl.$^4$ .............................................. H01L 29/80
[52] U.S. Cl. ........................................ 357/22; 357/16; 357/55; 357/61
[58] Field of Search ................. 357/16, 22 A, 22 MD, 357/30 B, 55, 61, 4

[56] References Cited

FOREIGN PATENT DOCUMENTS

| | | | |
|---|---|---|---|
| 0100529 | 2/1984 | European Pat. Off. | 357/22 MD |
| 0177374 | 4/1986 | European Pat. Off. | 357/4 |
| 0199435 | 10/1986 | European Pat. Off. | 357/22 MD |
| 59-123272 | 7/1984 | Japan | 357/22 MD |
| 60-144979 | 7/1985 | Japan | 357/22 MD |

OTHER PUBLICATIONS

H. Temkin et al., 1.5–1.6 μm $Ga_{0.47}In_{0.53}As/Al_{0.48}In_{0.52}As$ Multiquautram Well Lasers Grown by Molecular Beam Epitaxy, Appl. Phys. Lett. 42(10), May 15, 1983, pp. 845–847.

Zipperian et al., "A $GaAs/In_{0.25}Ga_{0.75}As/GaAs$ Modulation–Doped, Single, Strained Quantum-Well FET", *Inst. Phys. Conf. Ser. No. 79*, Chapt. 8, 1985, pp. 421–425.

Rosenberg et al., "An $In_{0.15}Ga_{0.85}As/GaAs$ Pseudomorphic Single Quantum Well HEMT,"*IEEE Electron Device Letters*, vol. ED2-6, No. 10, Oct. 1985, pp. 491–493.

Tsang, "$Ga_{0.47}In_{0.53}As/InP$ Multiquantum Well Heterostructure Lasers Grown by Molecular Beam Epitaxy Operative at 1.53 μm," *Appl. Phys. Lett.* 44(3), Feb. 1, 1984, pp. 288–289.

*Primary Examiner*—Andrew J. James
*Assistant Examiner*—William A. Mintel
*Attorney, Agent, or Firm*—Martin M. Novack

[57] ABSTRACT

A strained $In_yGa_{1-y}As$ layer is employed in a GaAs/$Al_xGa_{1-x}As$ transistor. Since the bandgap of $In_yGa_{1-y}As$ is much smaller than that of GaAs, there is no need for a troublesome large-mole-fraction of aluminum in the $Al_xGa_{1-x}As$ layer in order to maintain a large bandgap discontinuity. This and other advantages of the structure set forth result in devices having improved operating characteristics.

20 Claims, 6 Drawing Sheets

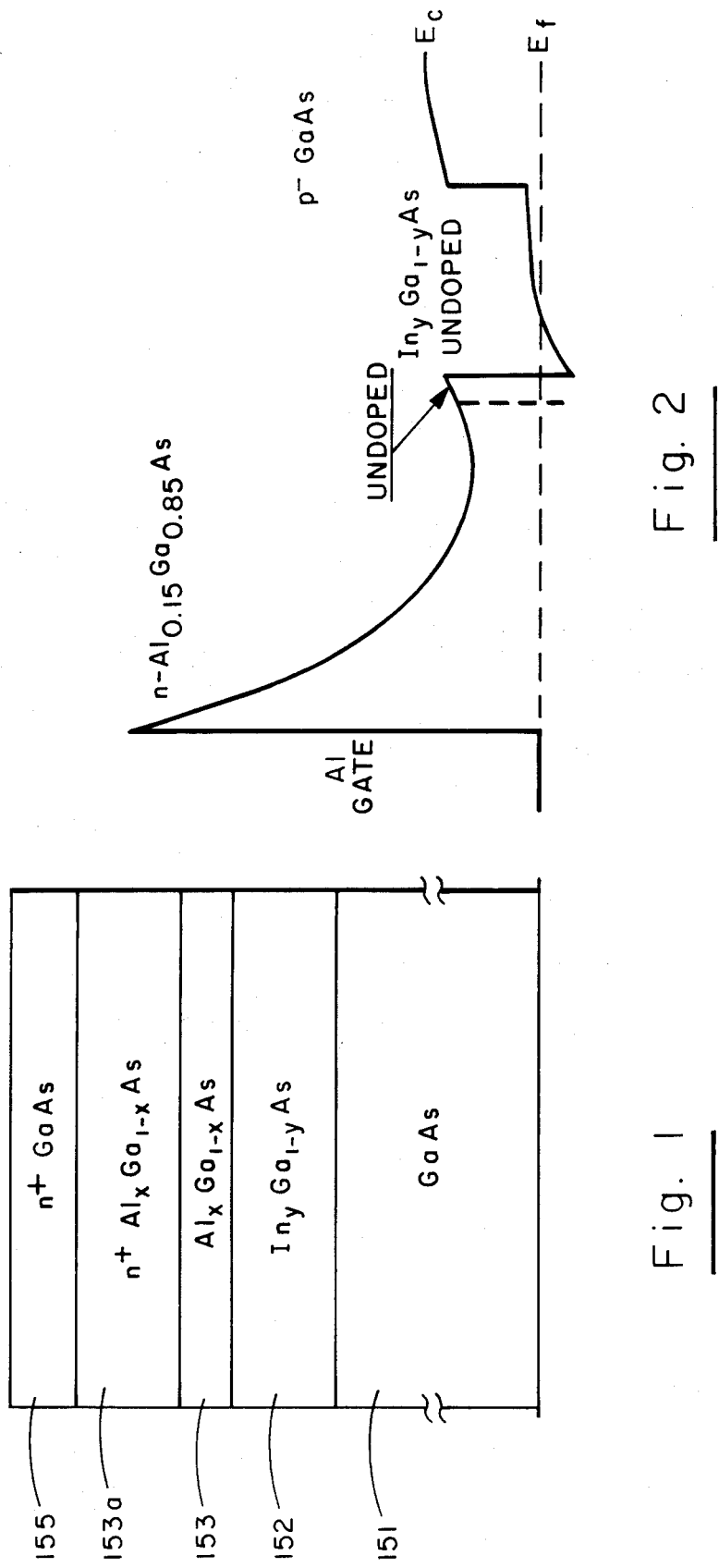

SEMICONDUCTOR DEVICE WITH STRAINED INGAAS LAYER

This invention was made with Government support, and the Government has certain rights in this invention.

BACKGROUND OF THE INVENTION

This invention relates to semiconductor devices and, more specifically, to a device which can be used as an improved transistor. The invention has particular application as a so-called modulation-doped field-effect transistor (MODFET).

The GaAs/AlGaAs MODFET has become well recognized for its superior low-noise performance compared with the GaAs MESFET. However, cryogenic operation of this device, where its advantages over the GaAs MESFET are most apparent, has not been ideal. So-called deep levels ("DX centres") in the $Al_xGa_{1-x}As$ with peculiar persistent properties can lead to the "collapse" of I/V drain characteristics. (See Drummond et al., "Bias Dependence and Light Sensitivity of (AlGa)As/GaAs MODFETs at 77K", IEEE Trans., 1983, pp. 1806–1811.) Also troublesome is the threshold voltage shift which occurs at 77K after the gate has been forward biased.

It has been suggested that one way to avoid these problems is to use $Al_xGa_{1-x}As$ with $x \leq 0.2$, where the DX occupation probability is significantly reduced. (See Lang et al., "Trapping Characteristics and A Donor-Complex (DX) Model For A Persistent Photoconductivity Trapping Center in Te-Doped $Al_xGa_{1-x}As$", Phys. Rev. B, 1979, 19, pp. 1015–1020.) Using a reduced Al mole fraction, however, reduces the conduction-band discontinuity of the heterointerface, which results in less efficient electron transfer and therefore a smaller two-dimensional electron gas (2DEG) concentration. Use of low Al mole fraction AlGaAs also compounds problems of the parasitic MESFET effect. (See Lee et al., "Parasitic MESFET in (Al,Ga)As/GaAs Modulation Doped FETs and MODFET Characterization", IEEE Trans., 1984, ED-31, pp. 29–35.)

An alternative solution proposed recently which avoids the AlGaAs altogether is to use InGaAs as the narrow bandgap material and GaAs as the larger-bandgap material. (See Rosenberg et al., "An InGaAs/GaAs Pseudomorphic Single Quantum Well High Electron Mobility Transistor", IEEE Electron Device Letters, EDL-6, 10, 1985.) In this structure, a quantum well (200 Angstroms in the device set forth) of $In_{0.15}Ga_{0.85}As$ was sandwiched between confining GaAs layers, the upper of which was silicon-doped. The $In_{0.15}Ga_{0.85}As$ quantum well layer is a strained layer (i.e., mismatch is accommodated as elastic strain). However, the use of GaAs as the high bandgap material has a similar drawback to the one noted above with respect to the small Al mole fraction in $Al_xGa_{1-x}As$; namely, that the conduction-band discontinuity is too small to achieve an adequate 2DEG concentration.

It is among the objects of the present invention to provide a semiconductor device which exhibits, inter alia, improved operating characteristics, and which overcomes problems of prior art devices as just set forth.

SUMMARY OF THE INVENTION

Applicant has discovered that improved device characteristics can be achieved by employing a strained $In_yGa_{1-y}As$ layer as, for example, the channel layer in a $GaAs/Al_xGa_{1-x}As$ MODFET transistor, with indium fraction preferably in the range 0.10 to 0.25 and aluminum fraction preferably in the range 0.05 to 0.20. Since the bandgap of $In_yGa_{1-y}As$ is much smaller than that of GaAs, there is no need for troublesome large-mole-fraction of aluminum in $Al_xGa_{1-x}As$ to maintain a large bandgap discontinuity. Higher doping densities are possible with low mole fraction $Al_xGa_{1-x}As$ due to reduced donor compensation. The AlGaAs trap density, which is in part proportional to the doping concentration [see Chand et al. "Comprehensive Analysis of Si-doped $Al_xGa_{1-x}As$ (x=0 to 1) Theory and Experiments", Phys. Rev. B., Vol. 30, pp. 4481–4493, October 1984], is significantly reduced in low mole fraction $Al_xGa_{1-x}As$. The transconductance of a MODFET with a $In_yGa_{1-y}As$ quantum well layer can also be expected to be improved because of a higher electron saturation velocity in InGaAs and a smaller average distance of the 2DEG from the interface due to improved carrier confinement in the quantum well. Regarding microwave performance, the improved electron saturation velocity in InGaAs can be expected to result in a significant increase in the limiting current gain cutoff frequency ($f_T$) compared with GaAs FETs. Generation-recombination noise can also be expected to be lower due to a reduction of occupied deep levels in low mole fraction $Al_xGa_{1-x}As$ (see Liu et al., "Noise Behavior of 1 $\mu$m Gate Length Modulation-Doped FETs", IEEE Electron Device Lett., Vol. EDL-6, pp. 453–455 (September 1985).

In accordance with an embodiment of the invention, a first semiconductor layer is provided and may be formed of gallium arsenide. A layer of indium gallium arsenide is disposed on the first semiconductor layer. The indium gallium arsenide layer is preferably a quantum well layer; i.e., a layer being sufficiently thin to exhibit quantum size effects. This layer preferably has a thickness in the range between about 100 Angstroms and 500 Angstroms. Regarding the composition of the indium gallium arsenide layer, the percentage of indium is preferably in the range between 10 and 25, it being demonstrated hereinbelow that higher percentages can provide certain desirable operating characteristics, but render more difficult the accommodation of mismatch. In certain devices hereof which exhibited superior operating characteristics, the indium fraction was 0.15 or 0.20. A layer of aluminum gallium arsenide is disposed on the layer of indium gallium arsenide, and a semiconductor overlayer, preferably of gallium arsenide, can be disposed over the layer of aluminum gallium arsenide. Relatively low mole fraction aluminum (preferably between 0.05 and 0.20) can be used in the AlGaAs layer.

In a form of the present invention, the described structure is utilized in a field effect transistor device, called a MODFET. In this form of the invention, spaced source and drain electrodes are provided for coupling signals respectively to and from the channel layer. These electrodes may be disposed, for example, on the gallium arsenide overlayer and diffused down to the channel layer, or other suitable means of electrode application may be employed. A gate electrode, positioned between the source and drain electrodes, is disposed on the aluminum gallium arsenide layer, and is used for application of a gate signal for controlling signal flow in the channel between the source and drain electrodes.

It will be understood that while an important application of the present device is in field effect transistors, the structure hereof can be employed in other types of devices, for example, bipolar transistors, light emitters, etc.

Further features and advantages of the invention will become more readily apparent from the following detailed description when taken in conjunction with the accompanying drawings.

BRIEF DESCRIPTION OF THE DRAWINGS

FIG. 1 is a cross sectional view showing layers of a structure in accordance with an embodiment of the invention and from which the devices of the invention can be made.

FIG. 2 is a band diagram of the FIG. 1 structure.

FIG. 4, which includes

DESCRIPTION OF THE PREFERRED EMBODIMENTS

Figure 3:
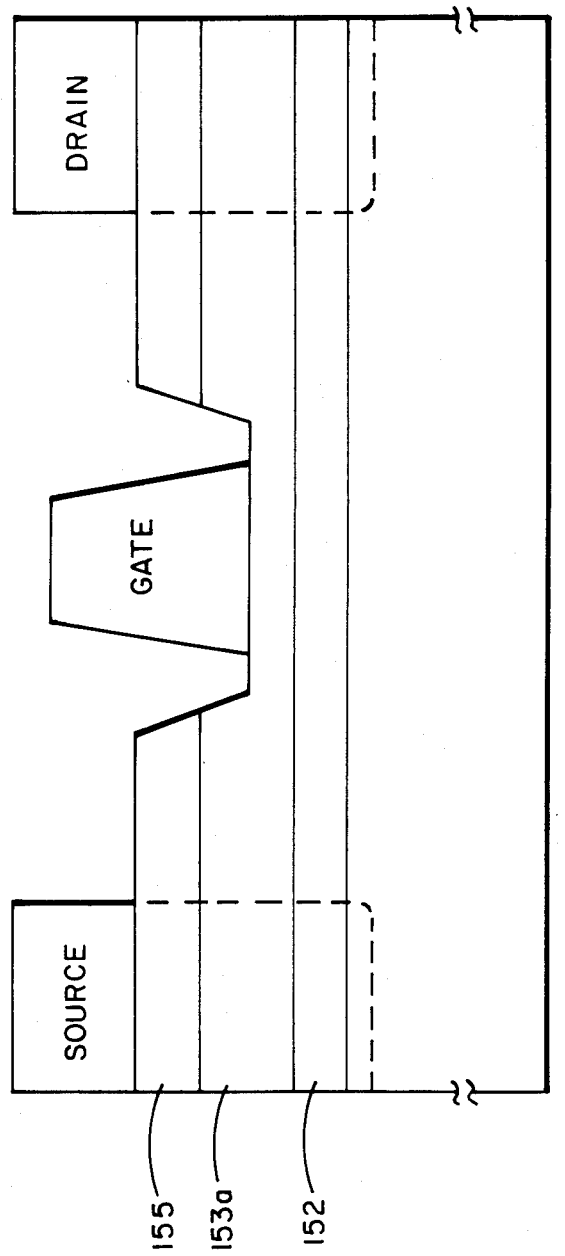
FIG. 3 is a simplified cross-sectional diagram of a field effect device in accordance with an embodiment of the invention.

FIG. 1 shows the layers of a structure in accordance with an embodiment of the invention and from which the devices of the invention can be made. A first semiconductor layer 151, formed, for example, of semi-insulating gallium arsenide of thickness 1 um, has deposited thereon a pseudomorphic quantum well layer 152 of indium gallium arsenide having a thickness, in this example, of 200 to 300 Angstroms. In the illustrated embodiment, the layer 152 may be, for example, of composition $In_{0.15}Ga_{0.85}As$. An undoped set-back layer 153 and a doped layer 153a are formed of aluminum gallium arsenide, and these layers are covered with a gallium arsenide cap layer 155 that facilitates formation of ohmic contact. In the present embodiment, the set-back layer 153 is a 30 Angstrom thick layer of undoped $Al_{0.15}Ga_{0.85}As$, the layer 153a is a 350 Angstrom thick layer of $Al_{0.15}Ga_{0.85}As$ doped $3\times 10^{18}$ cm$^{-3}$ with Si, and the cap layer 155 is a 200 Angstrom thick layer of n+ GaAs. The band diagram of the FIG. 1 structure (with a metal gate on the AlGaAs layer as in FIG. 3), is illustrated in FIG. 2.

The structure of FIG. 1 can be made, for example, using known molecular beam epitaxy (MBE) techniques. If desired, the GaAs buffer layer can be grown after a superlattice foundation of thin GaAs and AlAs layers (not shown) which tends to reduce contamination in the subsequent layers grown by MBE.

Using the structure as set forth, field effect transistor devices can be made as follows: Device fabrication begins with defining and etching of mesa isolation patterns using standard UV photolithographic and etching techniques. Source and drain regions are then defined in positive photoresist and AuGe/Ni/Au contacts evaporated. The metal is lifted-off and alloyed at 500° C. in hydrogen atmosphere. Nominal 1 um gate patterns in 3 um channels are defined using chlorobenzene treated photoresist (AZ4110). Next, a wet chemical etch is used to recess the gate region below the GaAs cap layer, and this step is immediately followed by evaporation of about 3000 Angstroms of aluminum. Finally a thick Ti/Au overlay metallization is deposited forming bond pads. A simplified diagram of a field effect device made in this way (without the set-back layer being shown) is illustrated in FIG. 3. The dashed regions represent the diffusions of the source and drain electrodes down to contact the channel layer 152.

For the measurements to be described, an unoptimized $1\times 290$ um T-gate FET structure is used for microwave characterization and half a $1\times 290$ um T-gate FET (145 um) is used for dc characterization. Fabricated wafers are scribed into individual devices and typical FETs bonded to TO-18 headers for dc measurements.

Figure 4A:
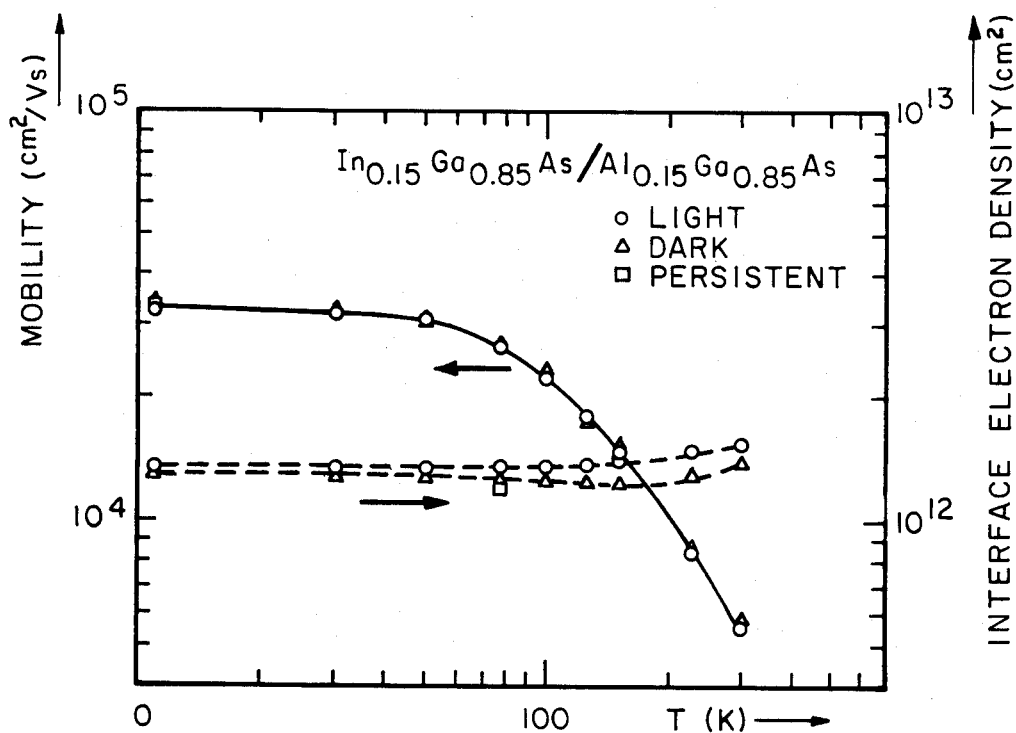
FIG. 4A and FIG. 4B, shows graphs of mobility and interface electron density for devices in accordance with the invention and for conventional GaAs/AlGaAs devices of similar structure.
Figure 4B:
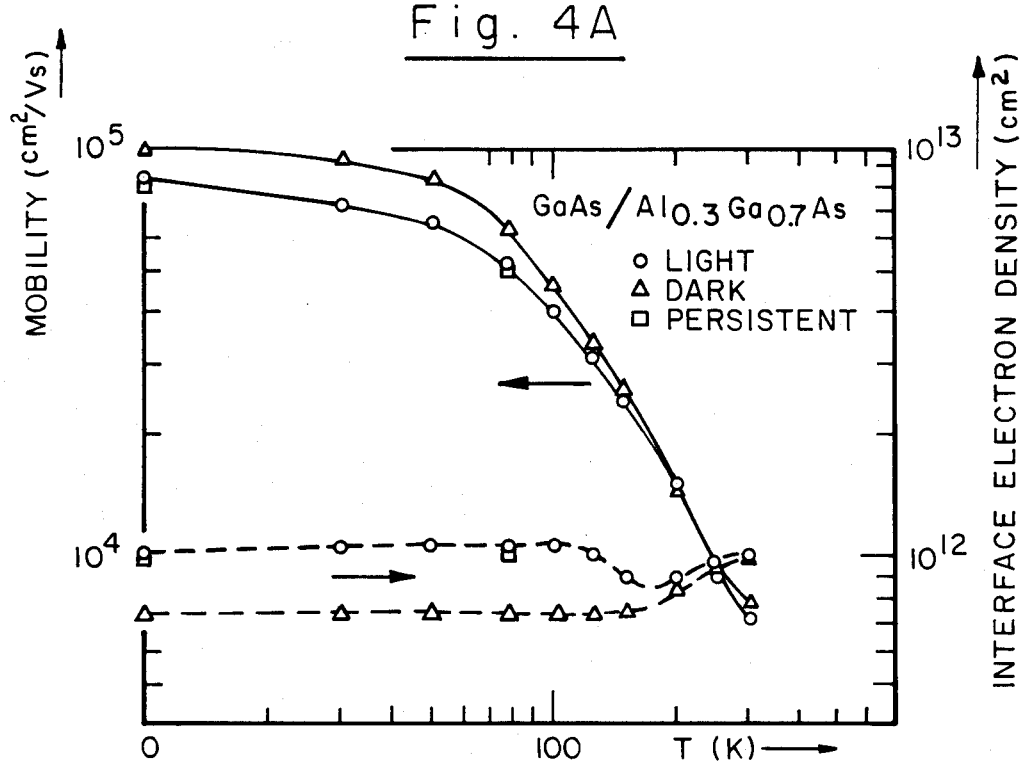

To demonstrate the superior cryogenic transport characteristics of InGaAs/AlGaAs pseudomorphic modulation-doped material as compared to the more conventional GaAs/AlGaAs structure, Hall measurements were made using the van der Pauw technique, with measurements being made down to 12K in the light and dark. At 12K and 77K measurements of persistent photoconductivity were performed by measuring the sample in the dark just following illumination. As shown in FIGS. 4A and 4B, there is virtually no change in either the mobility or sheet carrier concentration between light and dark for the InGaAs/GaAs sample (FIG. 4A) as compared to a conventional GaAs/AlGaAs sample of similar structure (shown in FIG. 4B). These data show that for similar carrier concentrations the larger mole fraction (for example, x=0.3) necessary in the GaAs/AlGaAs system results in significant light sensitivity and PPC effects.

Figure 5A:
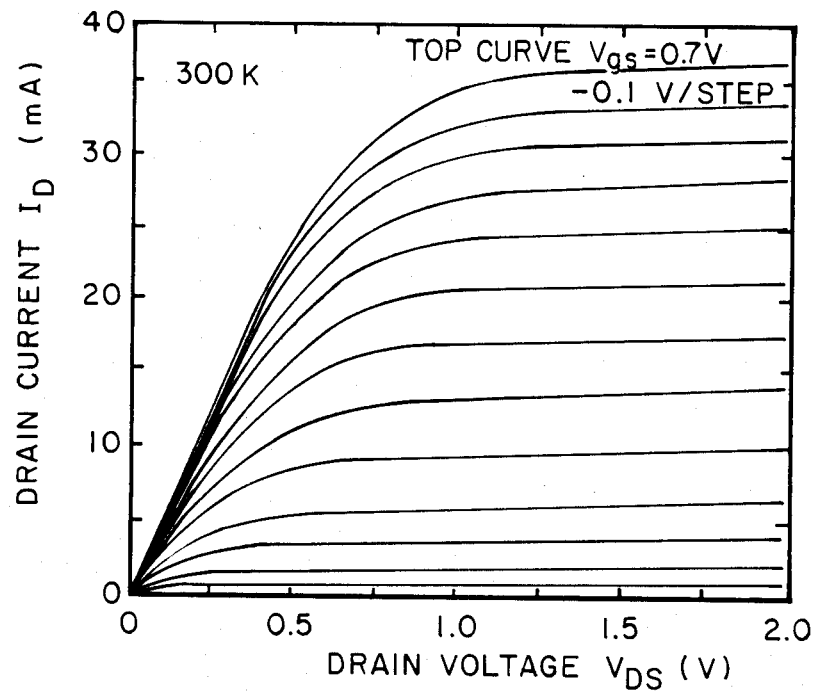
FIGS. 5A and 5B respectively show the current-voltage and FET transfer characteristics of a device in accordance with the invention, at 300K.
Figure 5B:
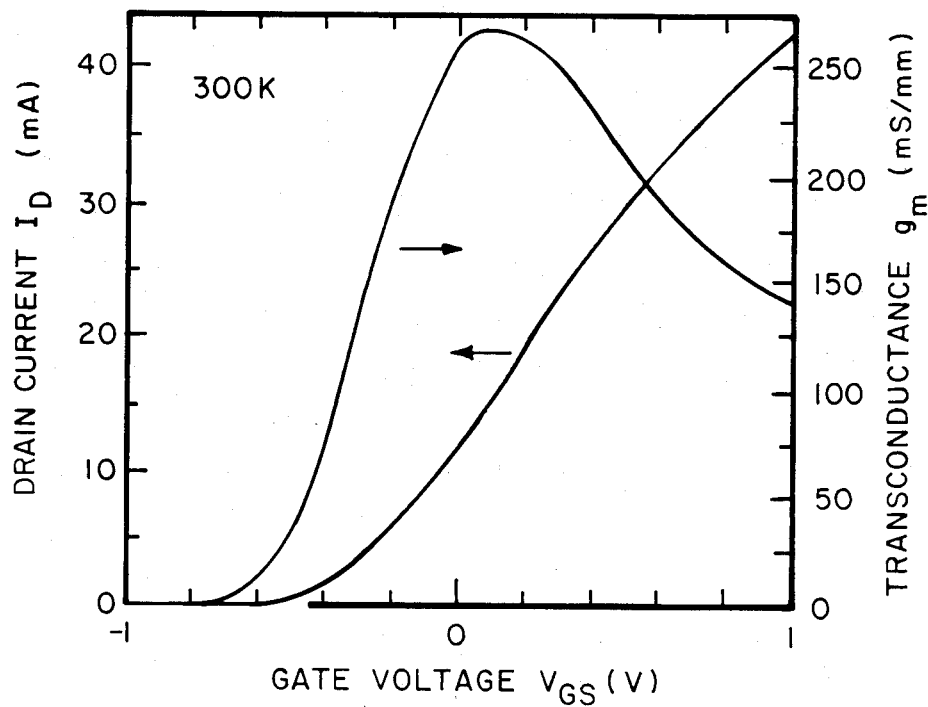

The devices hereof were dc characterized using a HP4145 semiconductor parameter analyzer at both 300K and 77K. The current-voltage and FET transfer characteristics at 300K are shown in FIGS. 5A and 5B, respectively, for the $1\times 145$ um pseudomorphic structure hereof. The curves show excellent saturation and pinch-off characteristics with an output conductance of 700 uS and an on resistance of 18 ohms. A threshold voltage, defined by a linear extrapolation of the drain current versus gate voltage to zero current of $-0.3$V is measured. A peak extrinsic transconductance for the described 15% In mole fraction device of 270 mS/mm at 300K is obtained at a gate voltage of $+0.1$V and a drain current density of 100 mA/mm. When the indium mole fraction was increased to 20% and the strained-quantum well size reduced to 150 Angstroms the transconductance climbed to 310 mS/mm at 300K. This transconductance is superior to reported transconductances for 1 um non-self-aligned GaAs/AlGaAs MODFET. (See, for example P. M. Solomon and H. Morkoc, "Modulation-doped GaAs/AlGaAs Heterojunction Field Effect Transistors (MODFETs), Ultrahigh-speed device for Supercomputers", IEEE Trans. on Electron Devices, Vol. ED-31, pp. 1015-1027, August 1984.)

Figure 6A:
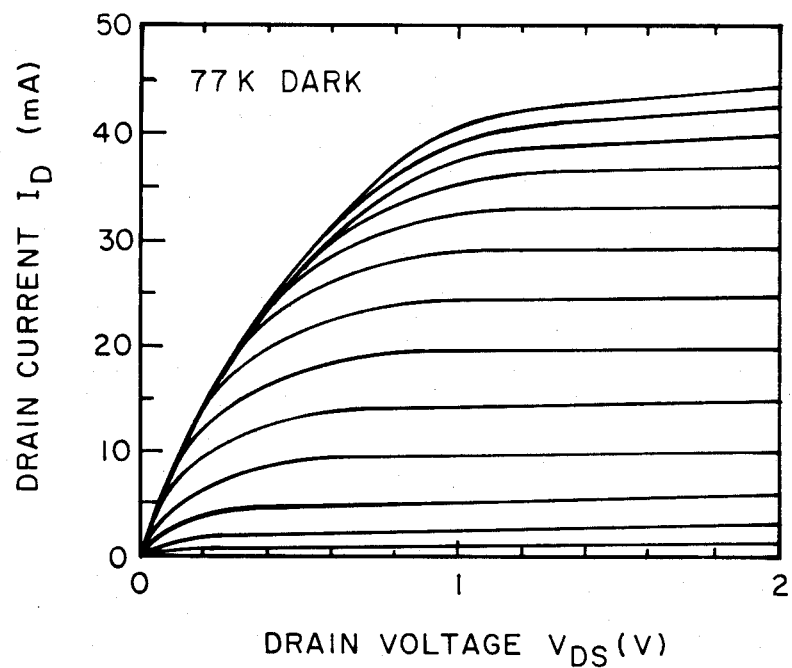
FIGS. 6A and 6B respectively show the current-voltage and FET transfer characteristics of a device in accordance with the invention, at 77K.
Figure 6B:
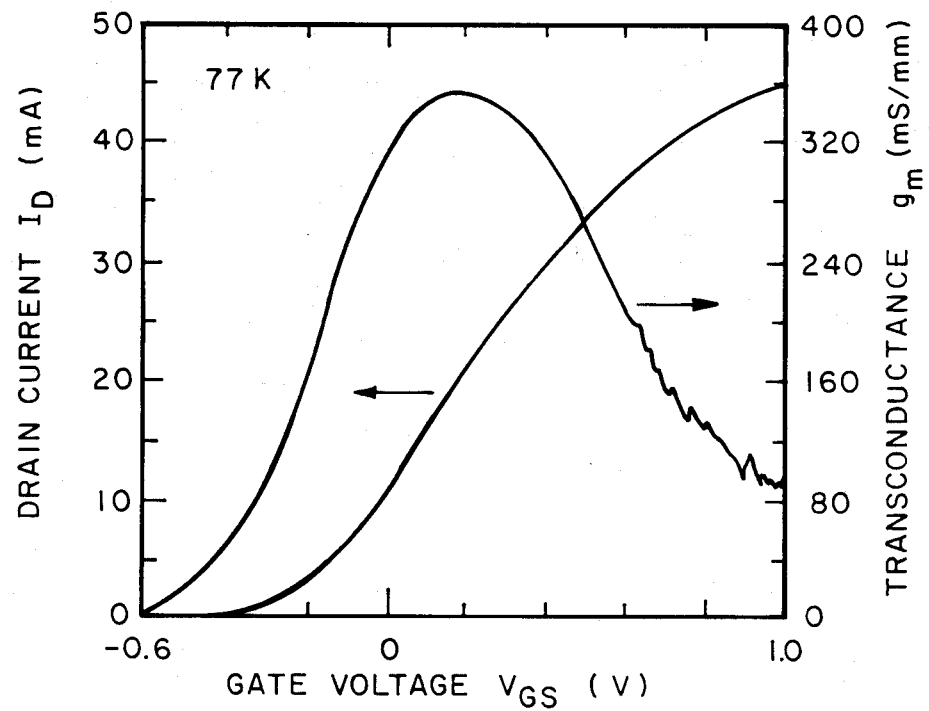

FIGS. 6A and 6B show the 77K dc characteristics for the 15% In mole fraction in the dark. There is no 'collapse' as is sometimes seen in $GaAs/Al_xGa_{1-x}As$ MODFETs using $x\geq 0.25$. When the device is illuminated, the curves remain virtually unchanged and completely return to their original values when the source of illumination is removed. Similar characteristics were observed for other indium mole fractions. Again the saturation is extremely sharp with an output conductance of only 200 uS and an on resistance of 10.9 ohms. The threshold voltage at 77K increased to $-0.2$V representing a shift of only about 0.1V from 300K. The peak transconductance increased to 360 mS/mm at a gate voltage of $+0.2$V and a current density of 125 mA/mm. The 20% indium mole fraction device again showed the highest transconductance of 380 mS/mm at 77K.

A large current swing is just as important as high transconductance for logic devices where gate capacitance charging time determines switching speed. At 1V on the gate, drain currents in excess of 290 mA/mm at 300K and 310 mA/mm at 77K were obtained. This demonstrates that significant current levels are possible with the InGaAs/AlGaAs heterojunction system.

An important problem with conventional GaAs/AlGaAs MODFETs is the positive shift in threshold voltage after a gate bias sufficient to fully turn-on the channel is applied. This device instability due to bias stress appears as a hysteresis in the FET transfer characteristics. A large positive gate voltage bends the conduction band in the (Al,Ga)As enough to allow energetic electrons to fill DX traps. The injected charge acts to decrease the 2DEG concentration and therefore shifts the transfer characteristic towards higher gate voltages. Similar effects have been reported for $Si/SiO_2$ MOSFETs (see S. A. Abbas and R. C. Dockerty, "Hot-carrier instability in IGFET's", Appl. Phys. Lett., vol. 27, pp. 147-148, August 1975).

While both bias stress threshold shifts and I-V "collapse" are measures for the quality of AlGaAs, in particular the DX occupation probability, many samples exhibiting no "collapse" show significant threshold shifts when stressed. The bias stress test is therefore a more sensitive indicator of AlGaAs trapping problems.

Figure 7:
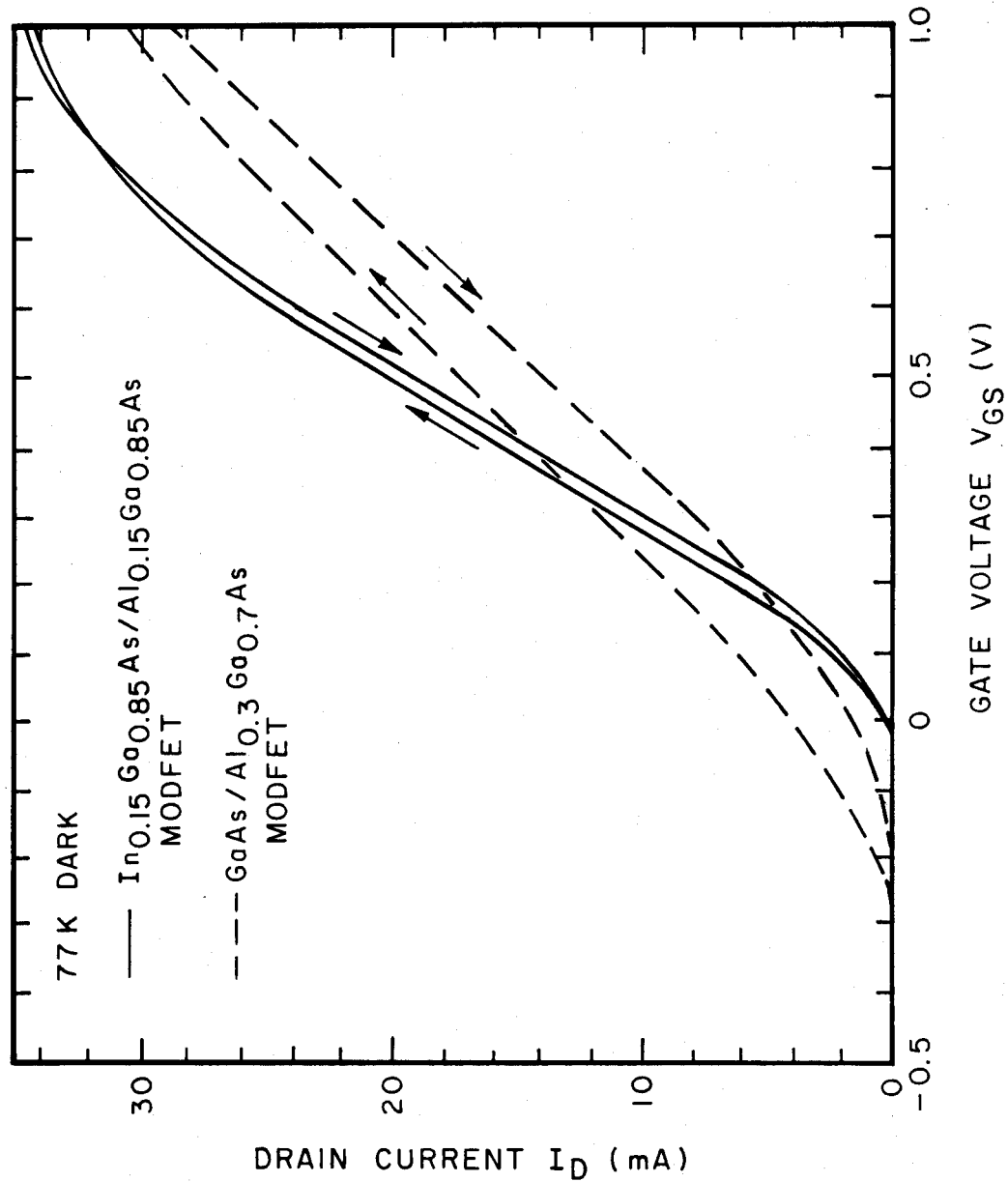
FIG. 7 shows the transfer characteristics before and after bias stress for both a pseudomorphic device in accordance with the invention and a conventional MODFET with similar threshold voltage and doping concentration.

FIG. 7 shows the transfer characteristic before and after bias stress for both a pseudomorphic $In_{0.15}Ga_{0.85}As/Al_{0.15}Ga_{0.85}As$ and a conventional $GaAs/Al_{0.3}Ga_{0.7}As$ MODFET with similar threshold voltage and doping concentration. Measurements were performed at 77K where the trap emptying time (order of minutes) is much longer than the measurement time (5s). Devices were cooled to 77K with $V_{DS}=2V$ and $V_G<V_{TH}$. A HP4140 pico-ammeter was used to monitor the drain current while the gate voltage was swept to $V_G=1V$, maintained for one minute, and swept back down to $V_G<V_{TH}$. FIG. 7 clearly indicates that the pseudomorphic $In_{0.15}Ga_{0.85}As/Al_{0.15}Ga_{0.85}As$ MODFET shows virtually no threshold shift while the conventional MODFET shows a 0.12V shift. This lack of threshold shift can be attributed to low mole fraction $Al_{0.15}Ga_{0.85}As$ where the percentage of occupied DX centers is significantly reduced because of the increase in equilibrium energy of DX centers over the Fermi energy (see D. V. Lang, R. A. Logan and M. Jaros, "Trapping Characteristics and a Donor-Complex (DX) Model For The Persistent-Photoconductivity Trapping Center In Te-doped $Al_xGa_{1-x}As$", Phys. Rev. B., vol. 19, pp. 1015-1030, January 1979). This bias stability is especially important for practical cryogenic device operation.

The devices hereof were also found to exhibit superior microwave performance as compared to conventional GaAs/AlGaAs MODFETs. A maximum frequency of oscillation of 40 GHz, about 30% better than conventional MODFETs of similar structures, and a current gain cut-off frequency of 24.5 GHz, about 100% better, were measured for devices hereof with a 0.2 indium fraction. Both of these frequencies were found to increase as the indium mole fraction was varied from $y=0.05$ to 0.2. Low-frequency noise measurements show that the noise is greatly reduced and represents nearly true the 1/f noise, and g-r noise is also drastically reduced. Preliminary high frequency (8 GHz) noise measurements indicate noise performance superior to conventional GaAs/AlGaAs MODFETs. The outstanding microwave characteristics and cryogenic stability exhibited by these devices make them very promising for high-speed logic and microwave applications.

The invention has been described with reference to particular preferred embodiments, but variations within the spirit and scope of the invention will occur to those skilled in the art. For example, as noted above, while the invented structure has particularly advantageous application to a field-effect transistor, it can also be employed in other types of devices, such as bipolar transistors and light emitters.

We claim:

1. A semiconductor device, comprising:
   a first semiconductor layer of gallium arsenide;
   a strained layer of indium gallium arsenide disposed on said first semiconductor layer;
   a layer of aluminum gallium arsenide disposed on said layer of indium gallium arsenide;
   means for coupling electrical signals to and from at least some of said layers.

2. The device as defined by claim 1 wherein said indium gallium arsenide layer comprises a layer of $In_yGa_{1-y}As$, where y is in the range between 0.10 and 0.25.

3. The device as defined by claim 1 wherein said layer of aluminum gallium arsenide comprises a layer of $Al_xGa_{1-x}As$, where x is in the range 0.05 to 0.20.

4. The device as defined by claim 2 wherein said layer of aluminum gallium arsenide comprises a layer of $Al_xGa_{1-x}As$, where x is in the range 0.05 to 0.20.

5. The device as defined by claim 1 wherein said layer of indium gallium arsenide is a quantum well layer.

6. The device as defined by claim 1 further comprising a semiconductor overlayer disposed on said layer of aluminum gallium arsenide.

7. The device as defined by claim 6 wherein said semiconductor overlayer comprises a further layer of gallium arsenide.

8. The device as defined by claim 1 wherein said further layer of aluminum gallium arsenide includes a set-back layer portion of undoped aluminum gallium arsenide and a layer portion of doped aluminum gallium arsenide.

9. A field effect transistor device, comprising:
   a first semiconductor layer of gallium arsenide;
   a channel layer of indium gallium arsenide disposed as a strained layer on said first semiconductor layer;
   a layer of aluminum gallium arsenide disposed on said layer of indium gallium arsenide;
   source and drain electrodes for coupling signals to and from said channel layer;
   a gate electrode for coupling a gate signal to said channel layer.

10. The device as defined by claim 9 wherein said indium gallium arsenide layer comprises a layer of $In_y Ga_{1-y}As$, where y is in the range 0.10 to 0.25.

11. The device as defined by claim 10 wherein said layer of aluminum gallium arsenide comprises a layer of $Al_x Ga_{1-x}As$, where x is in the range 0.05 to 0.20.

12. The device as defined by claim 10 wherein said layer of indium gallium arsenide is a quantum well layer.

13. The device as defined by claim 11 wherein said layer of indium gallium arsenide is a quantum well layer.

14. The device as defined by claim 9 further comprising a semiconductor overlayer disposed on said layer of aluminum gallium arsenide.

15. The device as defined by claim 14, wherein said semiconductor overlayer comprises a further layer of gallium arsenide.

16. A field effect transistor device, comprising:
a first gallium arsenide layer;
a channel layer of indium gallium arsenide disposed as a strained layer on said first layer;
a layer of aluminum gallium arsenide disposed on said layer of indium gallium arsenide;
a second layer of gallium arsenide disposed on said layer of aluminum gallium arsenide;
spaced source and drain electrodes disposed on said second layer of gallium arsenide, each of said electrodes coupling to said channel layer; and
a gate electrode between said source and drain electrodes, said gate electrode coupling to said layer of aluminum gallium arsenide.

17. The device as defined by claim 16 wherein said indium gallium arsenide layer comprises a layer of $In_y Ga_{1-y}As$, where y is in the range between 0.10 and 0.25.

18. The device as defined by claim 16, wherein said layer of aluminum gallium arsenide comprises a layer of $Al_x Ga_{1-x}As$, where x is in the range 0.05 to 0.20.

19. The device as defined by claim 17, wherein said layer of aluminum gallium arsenide comprises a layer of $Al_x Ga_{1-x}As$, where x is in the range 0.05 to 0.20.

20. The device as defined by claim 16, wherein said layer of indium gallium arsenide is a quantum well layer.

* * * * *